United States Patent
Paro Filho et al.

(10) Patent No.: US 10,461,764 B1
(45) Date of Patent: Oct. 29, 2019

(54) SYSTEM AND METHOD FOR INTERLEAVED DIGITAL-TO-ANALOG CONVERTER (DAC) CALIBRATION

(71) Applicant: IQ-Analog Corporation, San Diego, CA (US)

(72) Inventors: Pedro Emiliano Paro Filho, San Diego, CA (US); Costantino Pala, San Diego, CA (US)

(73) Assignee: IQ-Analog Corporation, San Diego, CA (US)

(*) Notice: Subject to any disclaimer, the term of this patent is extended or adjusted under 35 U.S.C. 154(b) by 0 days.

(21) Appl. No.: 16/430,560

(22) Filed: Jun. 4, 2019

(51) Int. Cl.
- *H03M 1/00* (2006.01)
- *H03M 1/10* (2006.01)
- *H03M 1/08* (2006.01)

(52) U.S. Cl.
CPC ....... *H03M 1/1009* (2013.01); *H03M 1/0836* (2013.01)

(58) Field of Classification Search
CPC .. H03M 1/1009; H03M 1/0836; H03M 1/121; H03M 1/1205
USPC ............................ 341/14, 155, 122, 159, 120
See application file for complete search history.

(56) References Cited

U.S. PATENT DOCUMENTS

| | | | |
|---|---|---|---|
| 8,171,335 B2 * | 5/2012 | Tsai | H03K 5/133 327/156 |
| 9,621,183 B2 * | 4/2017 | Baringer | H03M 3/46 |
| 9,685,969 B1 | 6/2017 | Adesh et al. | |
| 2019/0044524 A1 * | 2/2019 | Chandra | H03M 1/066 |

* cited by examiner

*Primary Examiner* — Peguy Jean Pierre
(74) *Attorney, Agent, or Firm* — Law Office of Gerald Maliszewski; Gerald Maliszewski

(57) ABSTRACT

A system and method are provided for calibrating an interleaved digital-to-analog converter (DAC). Sets of sub-DACs are enabled, and by creating a high frequency fundamental signal, spurs can be driven down sufficiently low in frequency to be sampled and digitally converted. By minimizing the power of these digital signals, the duty cycles of the different clock phases are calibrated. Then, sets of sub-DACs are enabled and high pass filtered, so that the spurs can be downconverted using corresponding phases of the clock, to a frequency low enough to sampled and digitally converted. The power of the digital signals is minimized as a first step in phase calibration. As a final step, all the sub-DACs are enabled, the high pass filter removed, and a high frequency fundamental signal is downconverted using at least two clock phases, so that the phase difference can be measured and corrected.

30 Claims, 12 Drawing Sheets

SYSTEM AND METHOD FOR INTERLEAVED DIGITAL-TO-ANALOG CONVERTER (DAC) CALIBRATION

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to digital-to-analog converters (DACs) to create high resolution analog signals with a large Spurious Free Dynamic Range (SFDR) and, more particularly, to a system and method for calibrating the duty cycle and phase relationships of an interleaved DAC.

2. Description of the Related Art

Interleaved DACs are perhaps the most suitable architecture for multi-gigabit per second (Gbps) applications. The interleaving operation allows for significantly higher conversion rates by combining the output of multiple sub-DACs, which are individually operated at a fraction of the composite output speed. Each sub-DAC, in turn, consists of a sizable group of switches and current sources, whose output current can be appropriately steered between the output positive and negative nodes, according to a corresponding digital input code.

Performance degradation in this type of DAC is mainly derived from two mechanisms: 1) static errors related to current-source mismatch and finite output resistance; and, 2) dynamic errors, typically due to code dependencies (e.g. output impedance) and timing errors (e.g. duty-cycle and clock time skew), among others, which can be induced by layout asymmetry, process variation, mismatch, and parasitic effects.

Interleaved DACs are particularly susceptible to dynamic errors, especially if Return-to-Zero (RZ) modulation is utilized. Although RZ signaling improves code-dependency and linearity by returning the switch control signals to a common (zero) state every sample period, the frequent transitions made synchronous to a high speed clock cause RZ-based interleaved DACs to be more sensitive to timing errors, including jitter, time skew, and duty-cycle mismatch between different clock phases.

While static errors can be somewhat easily fixed using foreground calibration loops, Dynamic Element Matching, and pre-distortion, timing errors are difficult to address, especially at ultra-high clock rates. At multi-Gbps operation, to achieve a superior spectral purity (high SFDR), the corresponding feedback loop should be able to detect and compensate for clock skew and timing errors in the order of tens (to hundreds) of femtoseconds, which can be extremely challenging to realize even using the most advanced technology.

FIGS. 1A through 1D depict an interleaved DAC architecture (prior art). As shown in FIG. 1A, four sub-DACs (sDACs) are driven, for example, by 16 Gbps data signals and individual 16 GHz (gigahertz) clock phases shifted by 90 degrees, to supply a 64 Gbps analog output signal. Each clock signal has a corresponding duty cycle and relative phase, which in an ideal case is uniform across all phases, with a 50% duty-cycle and an exact separation of 90 degrees between consecutive phases (FIG. 1B). At ultra-high speed operation, the slightest deviation from these ideal values (FIG. 1C) is known to produce large spurious harmonic content, significantly impacting the output signal's SFDR (FIG. 1D).

One solution is proposed in U.S. Pat. No. 9,685,969. However, the method described in the above-cited patent does not seem to be scalable (higher than interleave-by-2), and it does not provide for duty cycle calibration.

A comprehensive calibration device or method compatible with multi-Gbps operation is needed, and its lack leads to inevitable linearity and spectral performance degradation, which is mostly alleviated nowadays (but not fully addressed) through careful design and area consuming layout techniques.

It would be advantageous if an interleaved DAC could be calibrated to eliminate clocking duty cycle and phase mismatch errors.

SUMMARY OF THE INVENTION

Disclosed herein is a calibration scheme that provides an effective method to detect and calibrate for duty cycle mismatch and time skew between different clock phases driving multi-gigabit per second (Gbps) interleaved digital-to-analog converters (DACs), improving its spectral performance (SFDR) using a low frequency loop. A multi-step calibration method employs a low speed analog-to digital converter (ADC) in a feedback loop to provide the error information. This calibration method is capable of providing high sensitivity (femtosecond-range) to both duty cycle and phase errors, enabling superior spectral purity in ultra-high speed operation.

As noted above in the explanation of FIG. 1D, in interleaved architectures unwanted spurs due to duty-cycle and phase error are centered at fractions of the composite sampling frequency. For example, considering an interleave-by-4 DAC with a composite sampling frequency (FS) of 64 Gbps (each sub-DAC operating at 16 gigahertz (GHz)), spurious signals (spurs) due to timing errors appear around FS/2 (32 GHz) and FS/4 (16 GHz). The calibration method presented herein operates by directly translating these unwanted spurs to low frequencies, so they can be sensed, converted, and processed using a low speed ADC, and measured using a digital signal processor (DSP) with appropriate software, creating a minimal impact on cost and power consumption. This calibration method is extremely scalable and can be utilized with DAC architectures having any power of 2 (e.g., 2, 4, 8, 16, 32, etc.) interleaving factor.

Accordingly, a method is provided for calibrating an interleaved DAC. The method provides an interleaved DAC comprising $2^N$ sub-DACs, where N is an integer greater than or equal to 1. $2^M$ sub-DACs with unique phases of a first clock signal are selectively enabled to supply a summed analog signal including a fundamental (intended) analog signal and spurious signals offset from a multiple a first clock signal frequency, where M is an integer less than or equal to N. Using a second clock signal having a frequency that is typically lower than the first clock signal frequency, the spurious signals are sampled and converted to a digital conversion signal. In response to calibrating the duty cycles between enabled sub-DACs, the power of the conversion signal is minimized. Alternatively stated, by minimizing the power of the conversion signals, the duty cycles are calibrated.

The step of selectively enabling the sub-DACs to supply a summed analog signal includes supplying a fundamental analog signal higher in frequency than the Nyquist sampling limitation related to the second clock signal frequency. The step of sampling the spurious signals includes sampling spurious signals having a frequency within the Nyquist sampling limitation related to the second clock frequency. The spurious signals are offset by a first clock signal frequency multiple equal to half the number of simultaneously enabled sub-DACs, with the offset being equal to the fundamental analog signal frequency.

More explicitly, the duty cycle calibration is performed by selectively enabling the sub-DACs using the following sub-steps. In Step A, the method sets X=1, and sequentially enables $2^{N-X}$ pairs of sub-DACs, with the sub-DACs in each pair using a unique set of first clock signal phases separated by $360/2^X$ degrees. When $2^{N-X}$ is greater than or equal to 1, the method proceeds to Step B, by incrementing X by 1, incrementing the fundamental analog signal frequency, and sequentially enabling $2^{N-X}$ groups of sub-DACs, with sub-DACs in each group using a unique set of first clock phases separated by $360/(2^X)$ degrees. The method repeats Step B until $2^{N-X}$ is equal to 1.

Subsequent to calibrating the duty cycles, the method selectively enables sub-DACs to supply a summed analog signal comprising a fundamental analog signal within the Nyquist sampling limitation related to the second clock frequency and spurious signals offset from a multiple of the first clock signal frequency. After high pass filtering the fundamental analog signal, the spurious signals are downconverted to a frequency within the Nyquist sampling limitation related to the second clock frequency, using the phases associated with the enabled sub-DACs. In response to calibrating the differences in phase between enabled sub-DACs, the power of the conversion signals is minimized. Alternatively stated, the differences in phase are calibrated by minimizing the power of the conversion signals.

More explicitly, the initial act of phase calibration is performed by selectively enabling the sub-DACs using the following sub-steps. Step C sets Y=1, and sequentially enables $2^{N-Y}$ pairs of sub-DACs, with the sub-DACs in each pair using a unique set of first clock signal phases separated by $360/2^Y$ degrees. When $2^{N-Y}$ is greater than 1, the method proceeds to Step D, by incrementing Y by 1, incrementing the fundamental analog signal frequency, and sequentially enabling $2^{N-Y}$ groups of sub-DACs, with sub-DACs in each group using a unique set of first clock phases separated by $360/(2^Y)$ degrees.

Step D is repeated unless $2^{N-Y}$ is equal to 1, and then the method proceeds to Step E, by enabling all $2^N$ sub-DACs to supply a fundamental analog signal higher in frequency than the Nyquist sampling limitation related to the second clock frequency. After bypassing the high pass filtering, the fundamental analog signal is sequentially downconverted with at least a first phase and a second phase of the first clock signal. The downconverted fundamental analog signals are sampled and converted to digital conversion signals. A final phase calibration adjustment is made by measuring the difference in phase between the conversion signals.

Additional details of the above-described method, as well as a system for calibrating an interleaved DAC, are provided below.

DETAILED DESCRIPTION

Figure 1A:
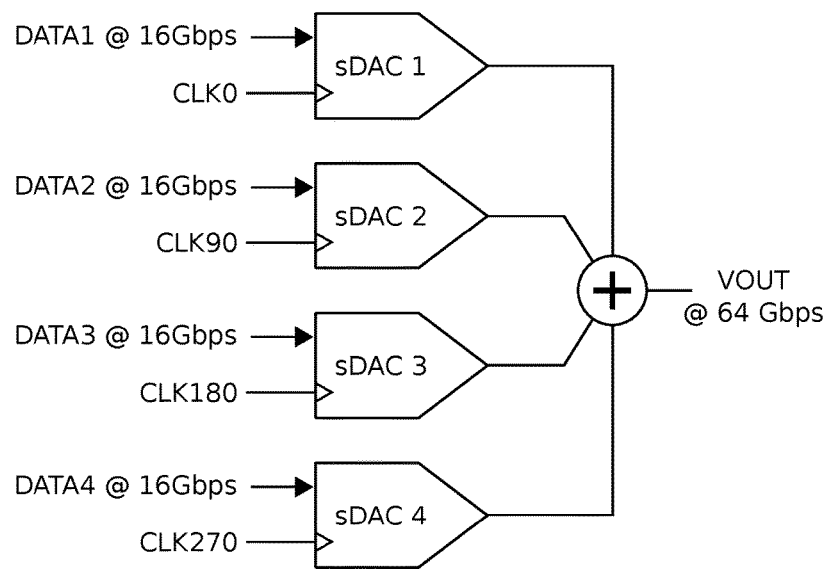
FIGS. 1A through 1D depict an interleaved DAC architecture (prior art).
Figure 1B:
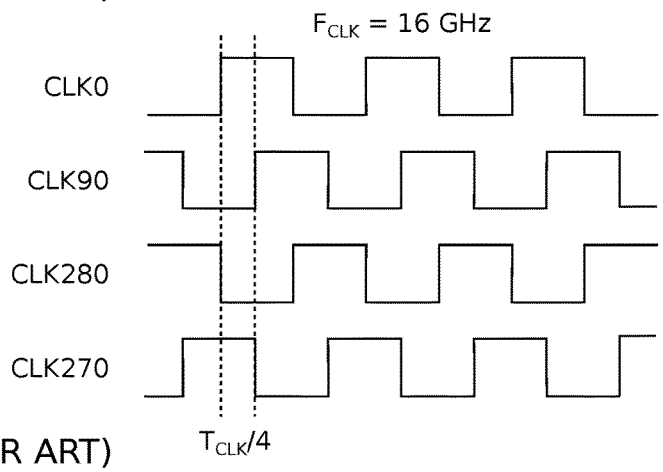
Figure 1C:
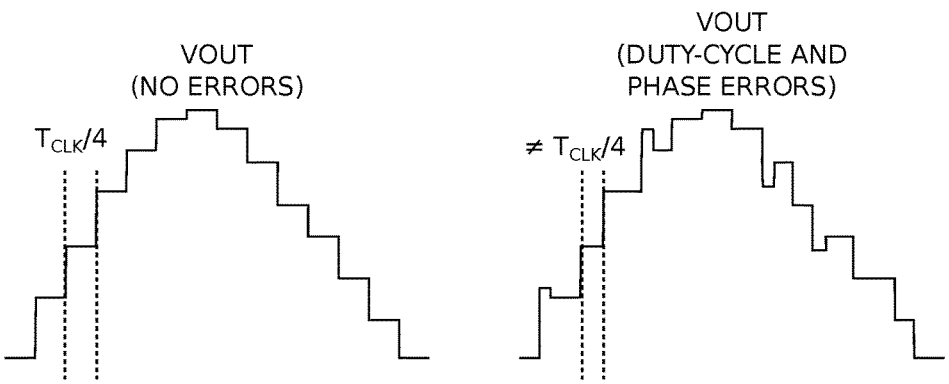
Figure 1D:
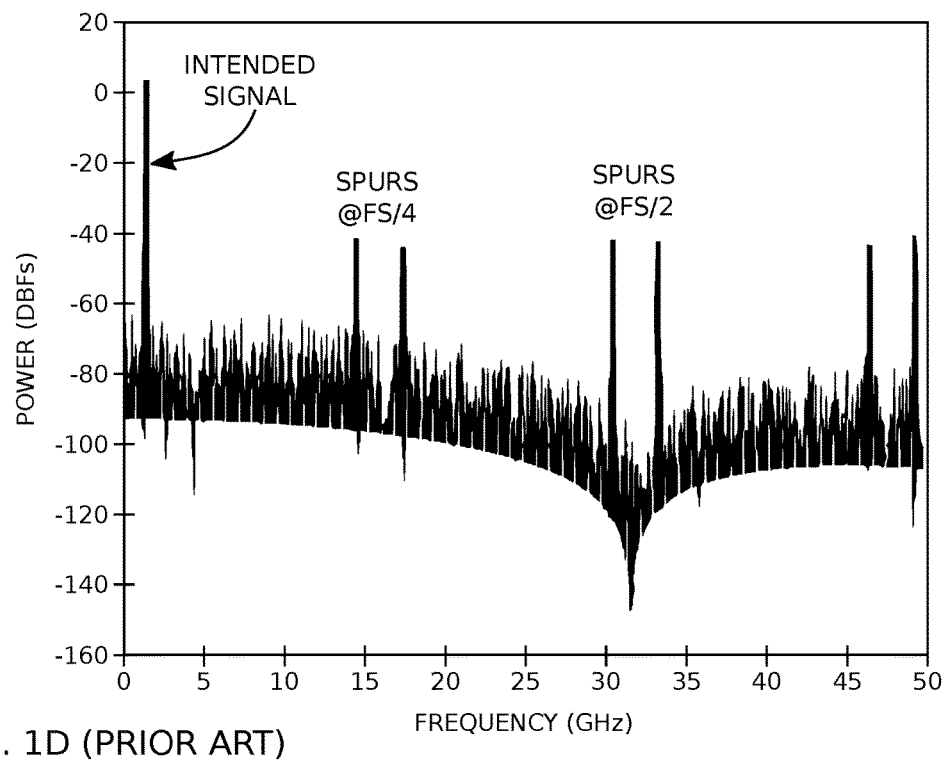
Figure 2:
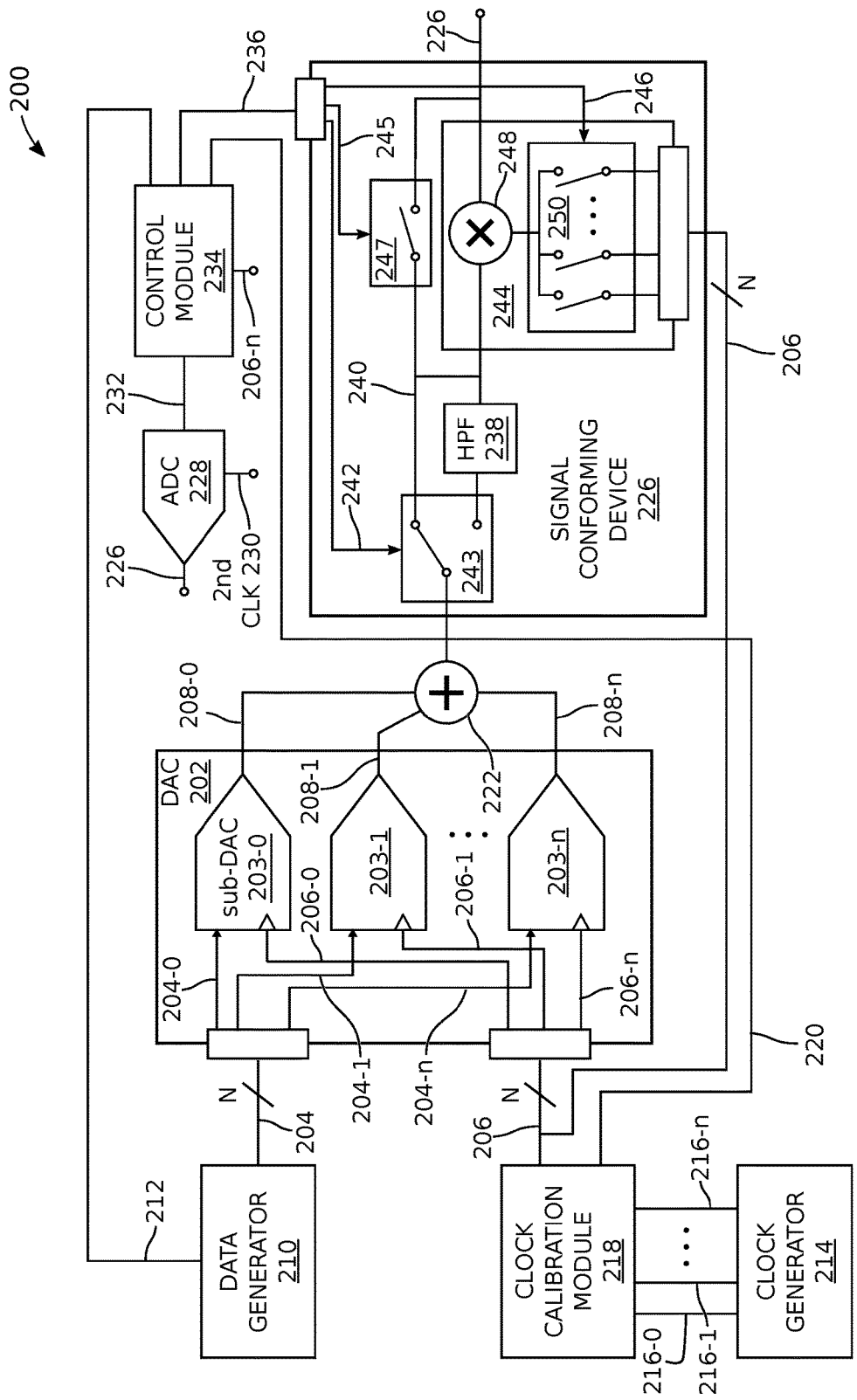
FIG. 2 is a schematic block diagram depicting a system for calibrating an interleaved digital-to-analog converter (DAC).

FIG. 2 is a schematic block diagram depicting a system for calibrating an interleaved digital-to-analog converter (DAC). The system 200 comprises an interleaved DAC 202, which, in turn, comprises $2^N$ selectively enabled sub-DACs, 203-0 through 203-n, where N is an integer greater than or equal to 1. For example, the sub-DACs may be current-steering. However, the system is not limited to any particular type of DAC architecture. Each sub-DAC has an input, respectively on lines 204-0 through 204-n (bundled as 204), to accept a digital data signal, a clock input, respectively on lines 206-0 through 206-n (bundled as 206), to accept a first clock signal with unique phase, and an output, respectively on lines 208-0 through 208-n, to supply analog signals converted from the data signal.

A data generator 210 has $2^N$ outputs on lines 204-0 through 204-n to respectively supply $2^N$ data signals to the $2^N$ sub-DACs corresponding to a fundamental (intended) analog signal (e.g., a voltage or current value), and an input on line 212 to accept signal generation commands. A clock generator 214 has an output to supply $2^N$ unique phases of the first clock signal on lines 216-0 through 216-n. A clock calibration module 218 has an input to accept the $2^N$ phases of the first clock signal, an input on line 220 to accept calibration signals, and $2^N$ outputs on lines 206-0 through 206-n to selectively supply unique phases of the first clock signal to the enabled sub-DACs in response to the calibration signals. Alternatively stated, the clock calibration module 218 selectively supplies $2^M$ unique phases of the first clock signal on lines 206-0 through 206-n to enabled sub-DACs in response to the calibration signals on line 220, where M is less than or equal to N.

In one aspect, different types of input signals can be used as stimuli in the calibration system to provide a certain spectral configuration and/or increase the measurement sensitivity against duty cycle and phase errors. For example, the input to each individual sub-DAC can be shifted in phase and made orthogonal, as in a quadrature modulator. The combination of quadrature-modulated orthogonal signals yields a complete image/sideband suppression as long as the amplitude and phase orthogonality between signal paths are accurately matched/observed. The slightest amplitude and/or phase error produces a significant increase in the power of the unsuppressed image, which can be used as a quantitative indicator of duty cycle or phase error. This embodiment can be enabled with no modifications in the hardware, just changing the calibration stimuli signals.

A summing device 222 has $2^N$ inputs, respectively on lines 208-0 through 208-$n$, to accept analog signals from enabled sub-DACs, and an output to supply a summed analog signal on line 224. Although the drawing implies single-ended signaling, the system can likewise be enabled using differential signaling. The summing device 222 may, for example, simply be a load or AC node connected to all the sub-DAC outputs, or a transformer. The summed analog signal comprises the fundamental analog signal with spurious signals offset from a multiple of the first frequency of the first clock signal. The spurious signals are responsive to duty cycle mismatch and first clock signal phases errors between enabled sub-DACs. A selectively bypassable signal conforming device 226, explained in more detail below, has a signal input on line 224 and a signal output on line 226. An analog-to-digital converter (ADC) 228 has a signal input on line 226 to accept the analog signals, a clock input on line 230 to accept a second clock signal, and an output on line 232 to supply a digital conversion signal converted from the analog signals. Although not necessary, the second clock signal is typically lower in frequency than the first clock signal first frequency.

A control module 234 has an input on line 232 to accept the conversion signal, an output on line 212 to supply the signal generation commands, an output on line 236 to supply signal conforming control signals to the signal conforming device 226, and an output on line 220 to supply the calibration signals to the clock calibration module 218. Typically, the control module is a digital signal processor equipped with appropriate software to measure the power and phase of the conversion signals. However, the system is not limited to any particular manner of measuring the power and phase of a digital signal. In one aspect, power is measured using a Fast Fourier Transform (FFT) algorithm. Alternatively, the power can be peak detected after bandpass filtering. As shown, one particular phase of the first clock signal, e.g., the phase on line 206-$n$, may be used as a timing reference for the control module measurements. Alternatively but not shown, the second clock can be used as a timing reference.

The signal conforming device 226 comprises a selectively bypassable high pass filter (HPF) 238 having a signal input to accept the summed analog signal on line 224, an output to supply a selectively filtered analog signal on line 240, and a control port to accept a filter bypass control signal on line 242. For example, the bypass is schematically represented by switch 243, which is responsive to the filter bypass control signals on line 242. A downconversion network 244 is selectively bypassable in response to downconversion bypass control signals on line 245. As shown, the bypass function is schematically represented by switch 247. The downconversion module 244 has a signal input on line 240 to accept the selectively filtered analog signal, a phase port to accept $2^N$ phases of the first clock signal from the clock calibration module on lines 206-0 through 206-$n$, a control port to accept a phase selection signal 246, a signal output to supply a selectively downconverted analog signals on line 226 to the ADC 228 responsive to the selected phases. For example, the downconversion network 244 may be enabled using mixers 248 and switch network 250, as shown. The signal conforming control signals supplied on line 236 are bundled to comprise the filter bypass control signals on line 242, the phase selection signals on line 246, and the downconversion bypass control signals on line 245. The signal conforming device 226 is bypassed when both the high pass filter 238 and downconversion module 244 are bypassed.

To calibrate for duty cycle, the signal conforming device 266 is bypassed, with switches 243 and 247 respectively bypassing the high pass filter 238 and downconversion network 244. The ADC 228 accepts spurious signals in an ADC input bandwidth related to the second clock signal frequency, in response to the fundamental analog signal having a frequency higher than the ADC input bandwidth. As is well known in the art, the Nyquist sampling theorem states that a sufficient condition exists when the sampling frequency is twice that of the signal being sampled. The summing device 222 supplies spurious signals offset from a multiple of the first frequency of the first clock signal, where the first frequency multiple is equal to half the number of simultaneously enabled sub-DACs. The above-mentioned offset is equal to the fundamental analog signal frequency.

More explicitly, the control module 234, in Step A, sets X=1, sequentially compares $2^{N-X}$ pairs of sub-DACs, with the sub-DACs in each pair using a unique set of first clock signal phases separated by $360/2^X$ degrees, and calibrates duty cycles by minimizing the power of the spurious signals for each set. When $2^{N-X}$ is greater than or equal to 1, the control module 234 in Step B increments X by 1, increments the fundamental analog signal frequency, and sequentially compares $2^{N-X}$ groups of sub-DACs, with sub-DACs in each group using a unique set of first clock phases separated by $360/(2^X)$ degrees, and calibrates duty cycles by minimizing the power of the spurious signals for each group. The control module 234 repeats Step B until $2^{N-X}$ is equal to 1.

Subsequent to calibrating the duty cycles, the control module 234 enables the high pass filter 238 to attenuate signals in the ADC bandwidth, and enables the downconversion network 244 to supply a downconverted spurious signal in the ADC bandwidth responsive to the selected phases. The control module 234 measures the power of the downconverted spurious conversion signals supplied by the ADC 228, and supplies calibration signals on line 220 to the clock calibration module 218 adjusting the difference between the first clock signal phases.

More explicitly, the control module 234 in Step C sets Y=1, sequentially enables $2^{N-Y}$ pairs of sub-DACs, with the sub-DACs in each pair using a unique set of first clock signal phases separated by $360/2^Y$ degrees, and uses the set of first clock signal phases to downconvert the spurious signals generated by the sub-DAC pair. The control module 234 minimizes the power of the downconverted spurious signals by calibrating the phase difference between corresponding first clock signal phases supplied for each sub-DAC pair. When $2^{N-Y}$ is greater than 1, the control module 234 in Step D increments Y by 1, increments the fundamental analog signal frequency, and sequentially enables $2^{N-Y}$ groups of sub-DACs, with sub-DACs in each group using a unique set of first clock phases separated by $360/(2^Y)$ degrees, and uses the set of first clock signal phases to downconvert spurious signals generated by the group of sub-DACs. The control module 234 minimizes the power of the downconverted spurious signals by calibrating the phase difference between corresponding first clock signal phases supplied for each sub-DAC group.

The clock calibration module 218 repeats Step D unless $2^{N-Y}$ is equal to 1, and then proceeds to Step E by supplying $2^N$ phases of the first clock signal to the DAC in response to calibration signals on line 220 from the control module 234, to enable all $2^N$ sub-DACs. The DAC 202 supplies a fundamental analog signal higher in frequency than the ADC input bandwidth in response to the control module 234 supplying appropriate signal generation commands on line 212 to the data generator 210. In Step E the control module 234 supplies filter bypass control signals on line 242 for bypassing the high pass filter 238, supplies phase selection signals on line 246 for sequentially downconverting the fundamental analog signal with at least a first phase and a second phase of the first clock signal, and measures the difference in phase. The control module 234 supplies calibration signals on line 220 to the clock calibration module 218 for calibrating the difference in phase between sequential conversion signals supplied by the ADC 228. In some aspects, finer phase calibration can be obtained by using more than two clock phases in Step E.

Figure 3:
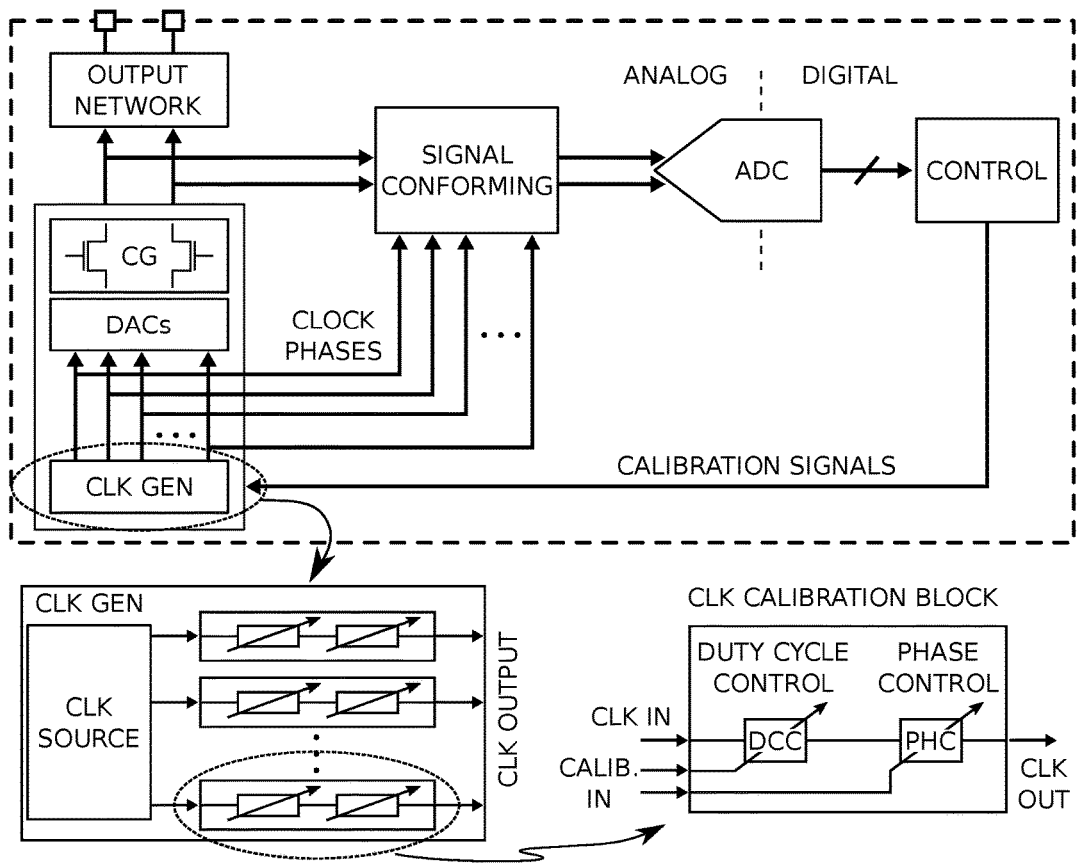
FIG. 3 depicts an alternative representation of the interleaved DAC calibration system of FIG. 2.

FIG. 3 depicts an alternative representation of the interleaved DAC calibration system of FIG. 2. As commonly observed in other control loop examples, the system is based on a sensing device/circuit (i.e. signal conforming device), whose analog output signal is converted to digital for processing and control/actuation. Although an interleave-by-4 architecture is depicted in the given examples presented below, the calibration system is extremely scalable and can be utilized with DAC architectures having any power of 2 (e.g., 2, 4, 8, 16, 32, etc.) interleave factor. In this example, the DAC supplies analog signals to a network of common gate (CG) transistors. It can be seen that the clock calibration block (clock calibration module) comprises duty cycle control (DCC) and phase control (PHC) capabilities.

The system utilizes a method consisting of two major calibration steps performed consecutively, starting with duty cycle calibration, and followed by clock skew/phase correction. In both cases, the interleave factor is first reduced to a minimum, and incrementally increased until all sub-DACs and corresponding clock phases have been calibrated accordingly.

Clock Duty Cycle Calibration

Figure 4A:
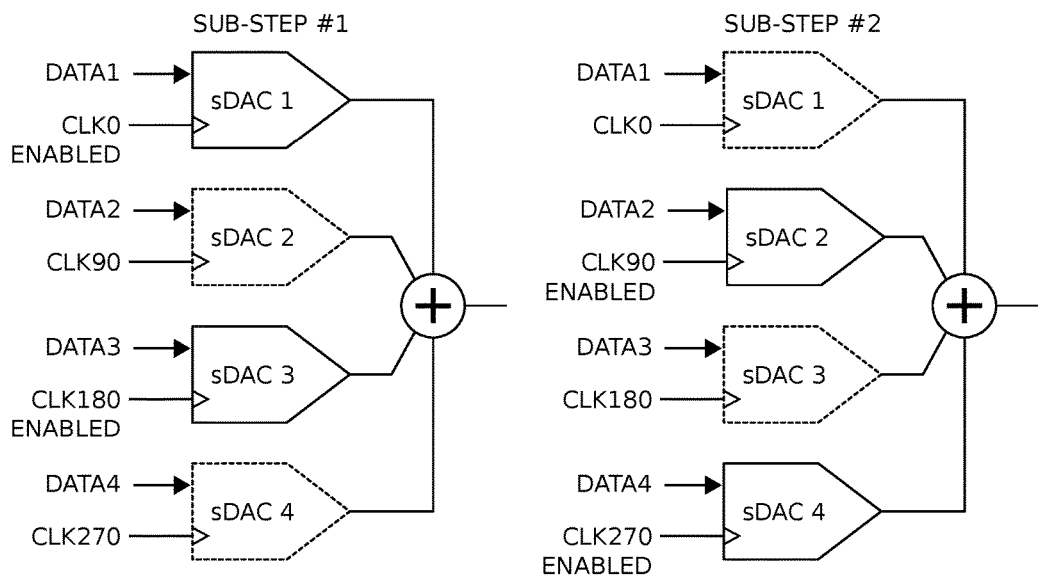
FIG. 4A is a diagram depicting an interleave-by-4 example, where the duty cycle calibration is performed as a sequence of sub-steps, starting by successively selecting and enabling complementary sub-DACs and adjusting their clock duty cycle, pair by pair.

FIG. 4A is a diagram depicting an interleave-by-4 example, where the duty cycle calibration is performed as a sequence of sub-steps, starting by successively selecting and enabling complementary sub-DACs and adjusting their clock duty cycle, pair by pair. "Complementary-phase" sub-DACs is the term used herein to refer to those sub-DACs driven by clock phases that are nominally 180 degrees apart. By enabling only two (complementary-phase) sub-DACs at a time, the interleave factor is limited to two. Complexity is thus significantly reduced, since only one clock has to be adjusted at a time for both duty-cycles to be matched. The order in which these sub-steps are taken is arbitrary.

Figure 4B:
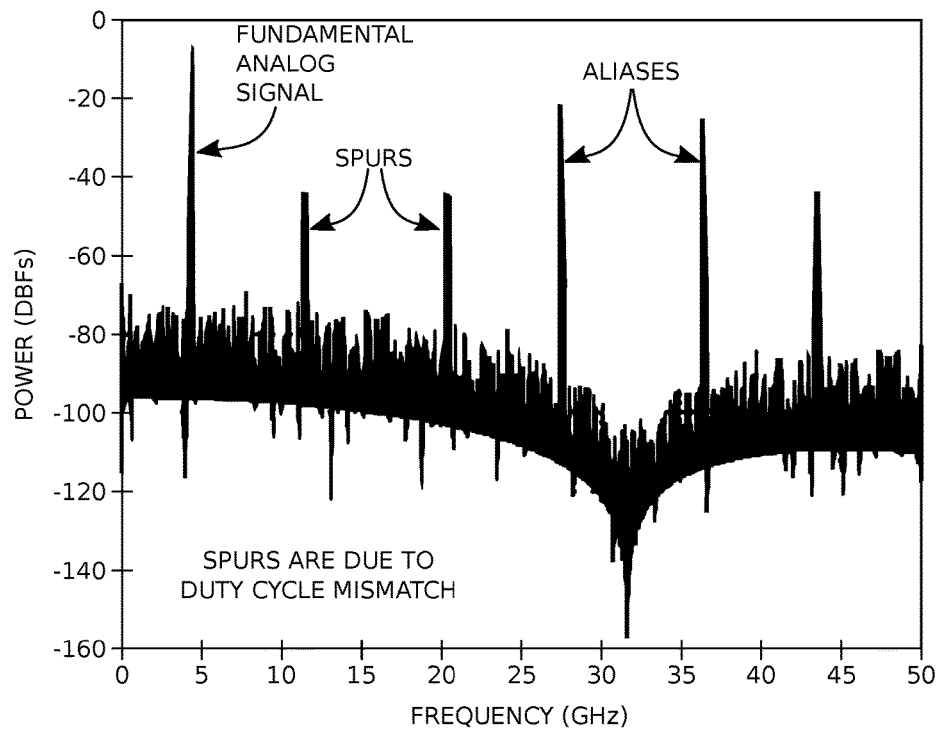
FIG. 4B depicts a frequency spectrum associated with the sub-steps of FIG. 4A, assuming a clock rate of 16 GHz.

FIG. 4B depicts a frequency spectrum associated with the sub-steps of FIG. 4A, assuming a clock rate of 16 GHz. The fundamental analog signal is at 4 GHz and spurs (spurious signals) are offset from the clock frequency by the frequency of the fundamental analog signal. The spurs shown in the spectrum are only due to duty-cycle mismatch in this case.

If an interleave-by-8 architecture is used instead, this part of the calibration process would be divided into 4 sub-steps, where the following complementary clock pairs would be calibrated together: CLK0/CLK180, CLK45/CLK225, CLK90/CLK270 and CLK135/CLK315 (the order is arbitrary).

Figure 5A:
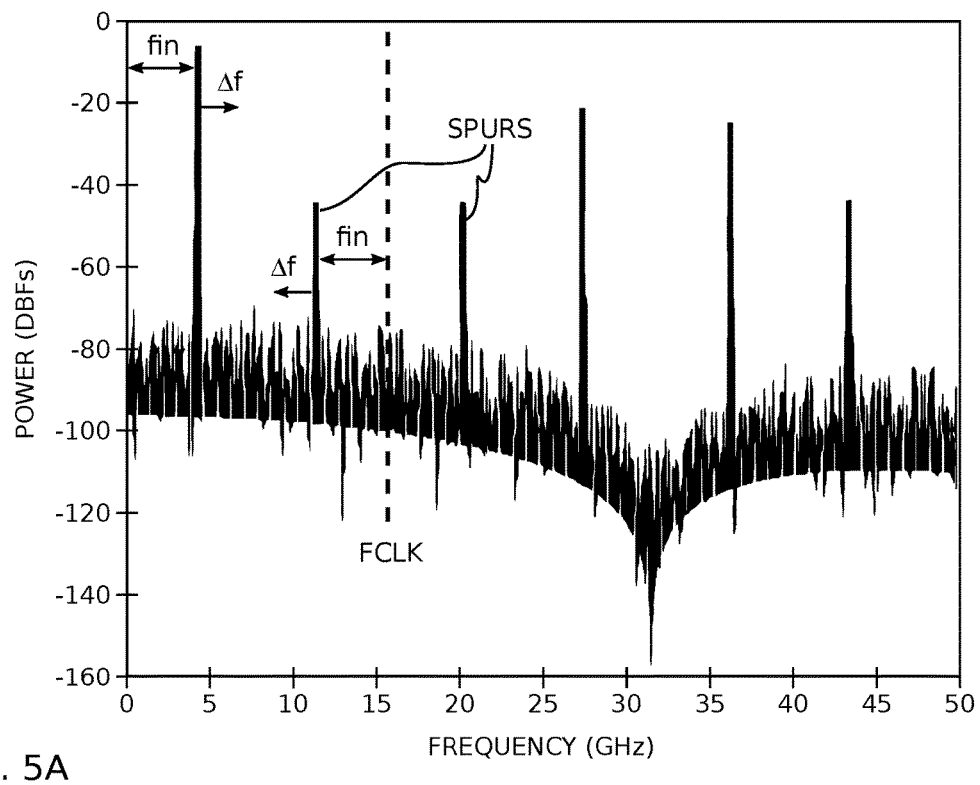
FIGS. 5A and 5B depict a frequency spectrum distribution of DAC output tones (fin) moved higher in frequency, so that unwanted spurs move lower in frequency.
Figure 5B:
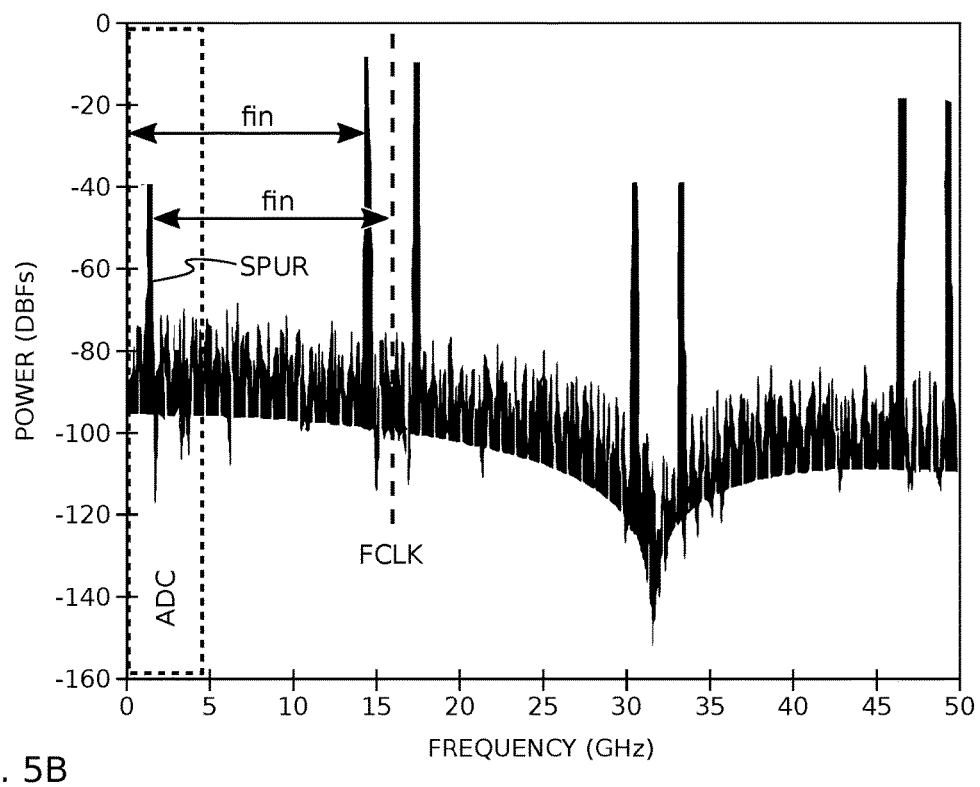

By analyzing the output signal spectrum during these calibration steps, it can be verified that by limiting the interleave factor to two, the signal aliases are now positioned at twice the clock frequency (32 GHz in this example), and the unwanted spurs created by unmatched duty-cycle are mirrored around the clock frequency (FCLK=16 GHz), with a frequency offset identical to fin (the fundamental analog signal frequency) as shown in FIGS. 5A and 5B.

FIGS. 5A and 5B depict a frequency spectrum distribution of DAC output tones (fin) moved higher in frequency, so that unwanted spurs move lower in frequency. As the output tone frequency is increased, the corresponding (lower side) spur is shifted lower in frequency. Therefore, by increasing the frequency of the input signal (fin), the spur can be accordingly translated to low frequencies, sensed, and then digitized with a low-speed ADC. The converted data is then used to set the duty cycle, by searching for the calibration points leading to the minimum spur amplitude/power, as is achieved once both of the clocks' duty cycles are matched. The search can be implemented using any optimization method including, but not limited to, a binary search or a simulated annealing algorithm. The optimization method can be implemented in hardware, software, or both. The same measurement technique is repeated until every pair of complementary sub-DACs has been calibrated.

Figure 6A:
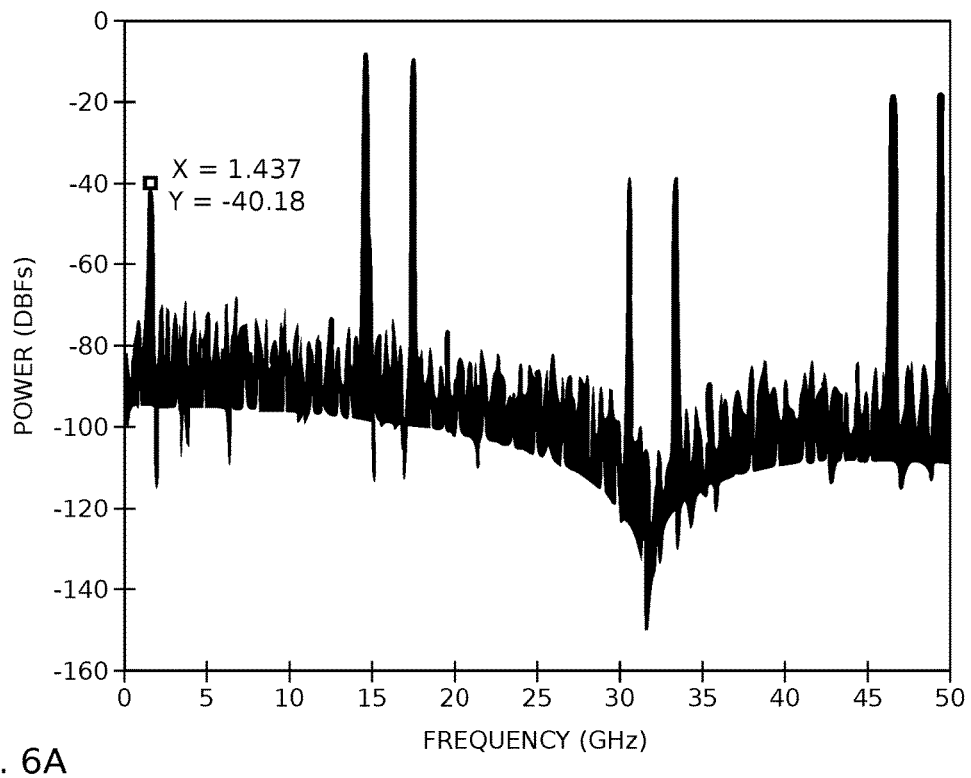
FIGS. 6A and 6B depict spurious signal power for a duty cycle mismatch of 1% and 0.01%, respectively.
Figure 6B:
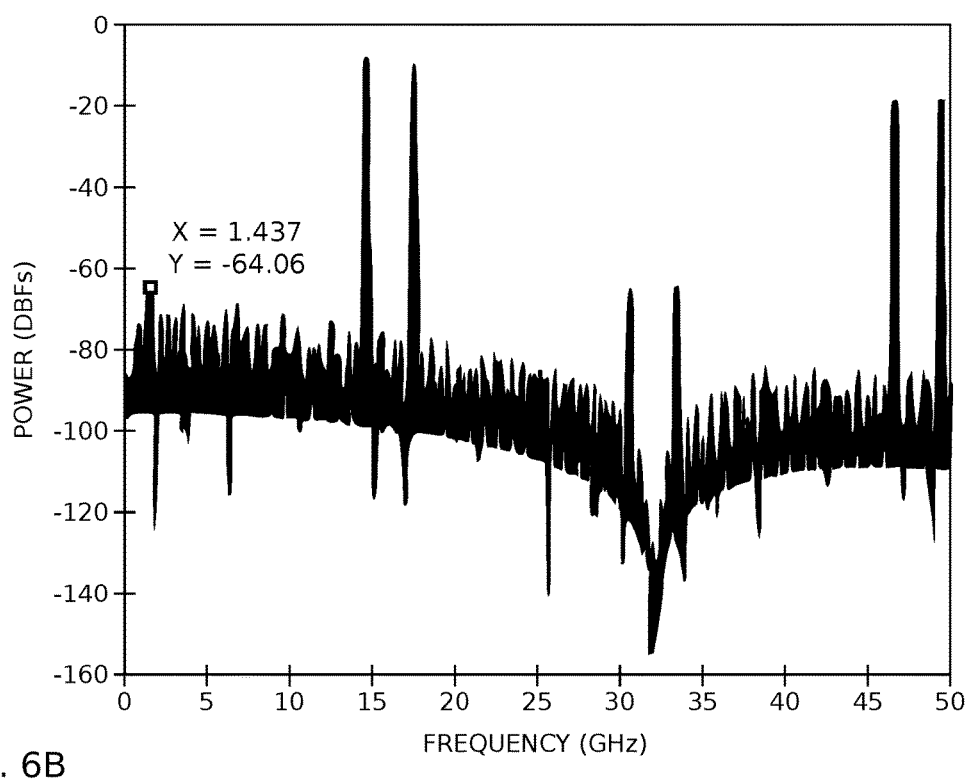

FIGS. 6A and 6B depict spurious signal power for a duty cycle mismatch of 1% and 0.01%, respectively. A difference of 24 decibels (dB) is observed between measurements, demonstrating the large sensitivity capability of the applied calibration method.

At this point however, there is no guarantee that duty cycle between different pairs is the same. For this reason, the same type of measurement is repeated, but now selecting sub-DACs in increasing larger groups of 4, 8, and so on. In an interleave-by-8 DAC architecture for example, this part of the calibration process would be divided into two sub-steps, where the following combination of sub-DACs would be enabled/calibrated (in no particular order): CLK0/CLK90/CLK180/CLK270, and CLK45/CLK135/CLK225/CLK315.

Figure 7A:
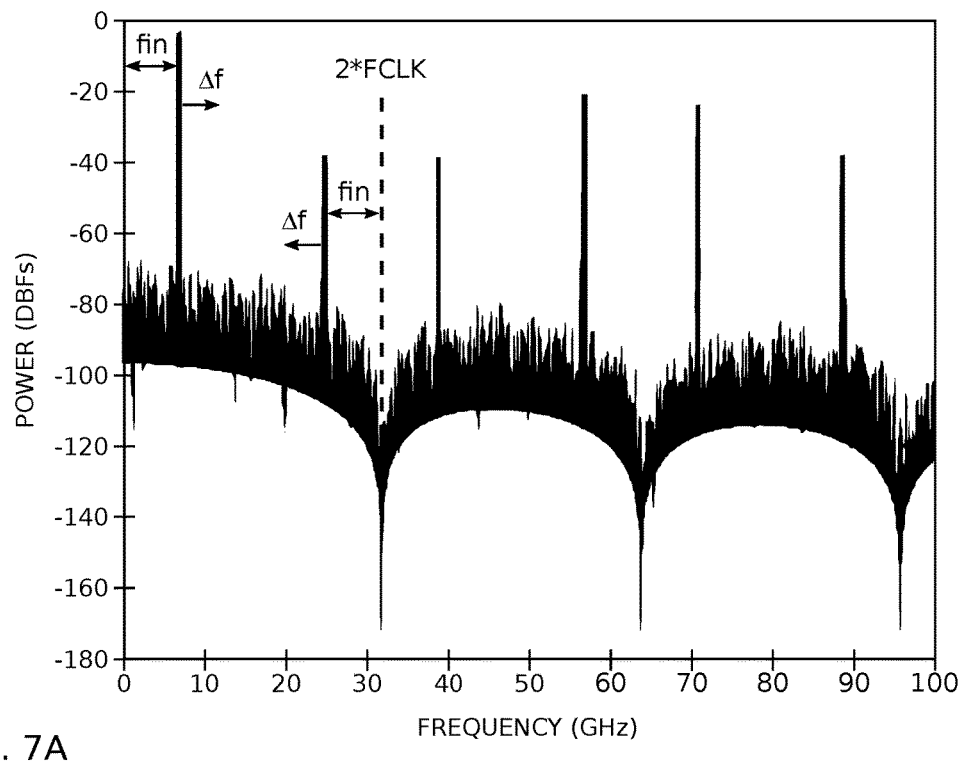
FIGS. 7A and 7B depict a frequency spectrum distribution of DAC output tones (fin) moved higher in frequency, using four simultaneously enabled sub-DACs.
Figure 7B:
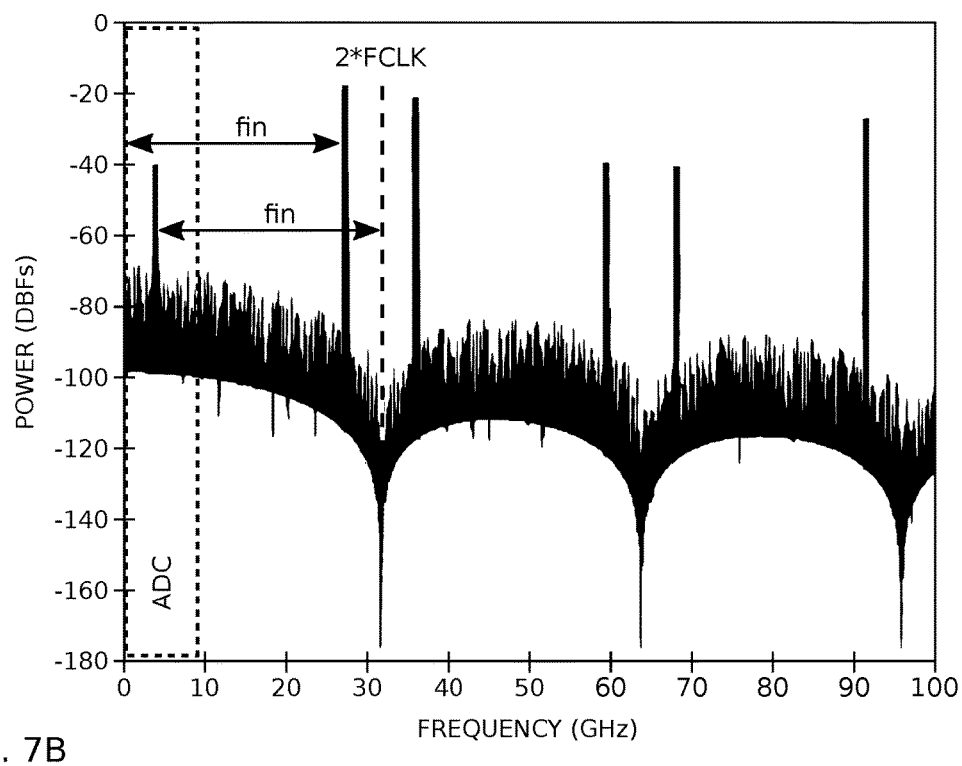

FIGS. 7A and 7B depict a frequency spectrum distribution of DAC output tones (fin) moved higher in frequency, using four simultaneously enabled sub-DACs. Once the number of selected sub-DACs is increased, the sensed spurs are shifted to higher multiples of the clock frequency (2*FCLK as shown in FIG. 7A). By increasing the input frequency (fin), the spur can be translated again to the 1st Nyquist zone of the feedback ADC and used to equalize the duty cycle among the different pairs involved.

The same process described above is repeated for an increasing number of enabled sub-DACs, until all sub-DACs are enabled at once, and duty cycle is made homogeneous across all clock phases.

Clock Phase Calibration

After duty-cycle calibration, the spur power becomes mostly sensitive to phase errors between sub-DAC clock phases. Therefore, a similar approach is used for initially measuring the power of unwanted spurs caused by phase errors that have been translated to lower frequencies, followed by a final step of measuring phase differences between different measurements of the fundamental analog signal that is sequentially downconverted using at least two different clock phases.

Figure 8A:
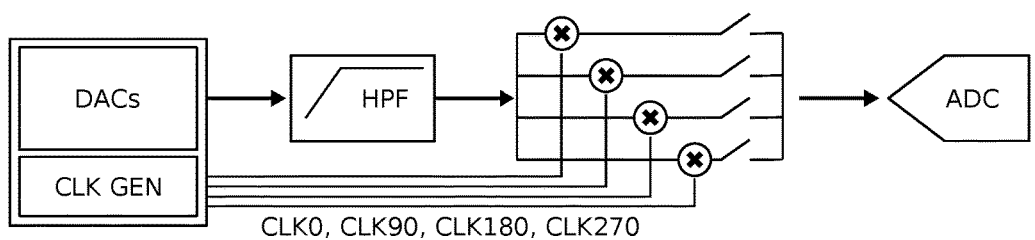
FIGS. 8A through 8C respectively represent a simplified schematic of the calibration system during Steps C and D, the frequency spectrum prior to downconversion, and the frequency spectrum after downconversion in performance of the initial step of phase calibration.
Figure 8B:
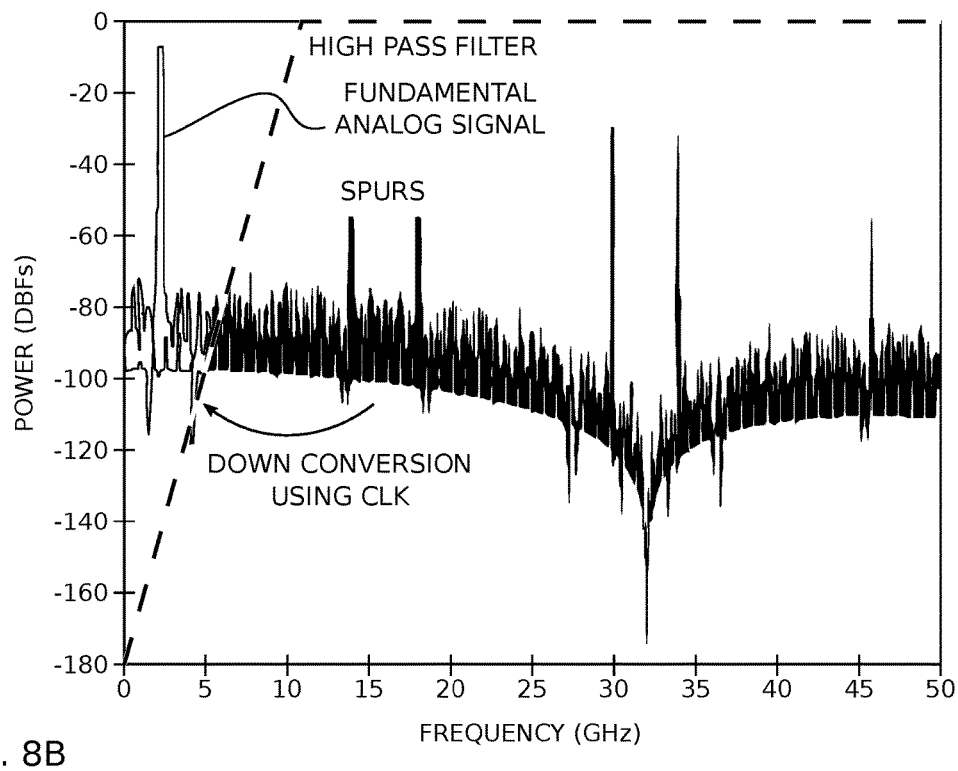
Figure 8C:
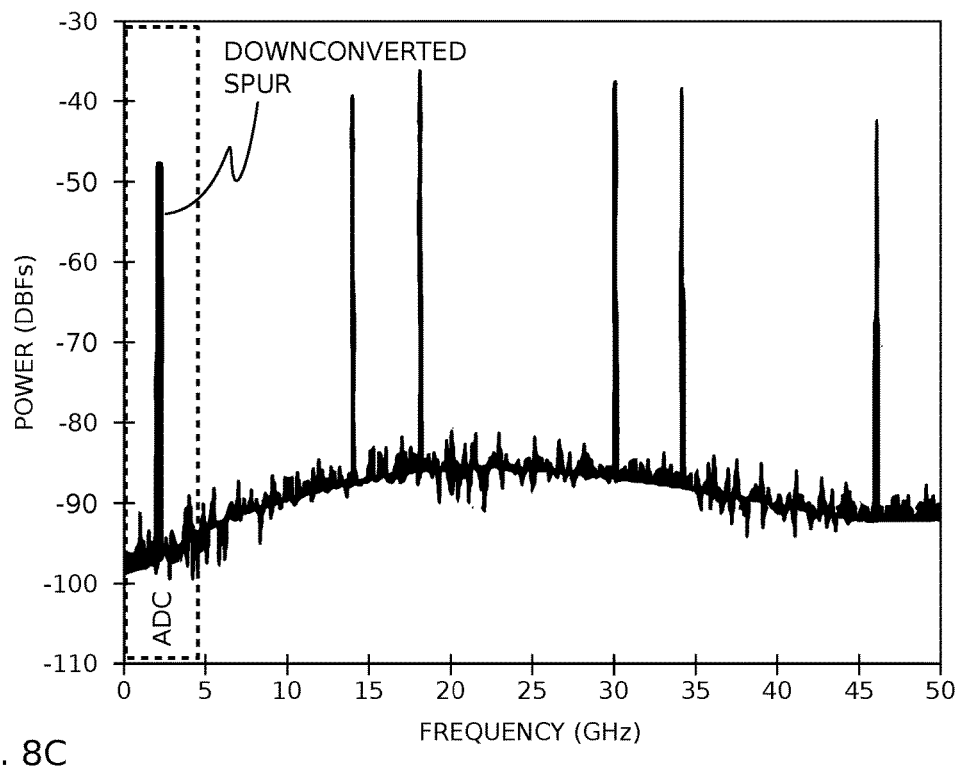

FIGS. 8A through 8C respectively represent a simplified schematic of the calibration system during Steps C and D, the frequency spectrum prior to downconversion, and the frequency spectrum after downconversion in performance of the initial step of phase calibration. Instead of shifting the sensed spur by increasing the input signal's (fn) frequency, as was done for the duty cycle calibration, the unwanted spur is translated to lower frequencies by direct downconversion using one of the clock phases. To measure the spur without overlapping with the actual DAC output tone (fundamental analog signal), a high-pass filter is utilized.

As in the duty cycle calibration, the first step of phase calibration consists of reducing the interleave factor to 2, and sequentially calibrating the phase of complementary sub-DACs, pair by pair. The calibration continues by increasing the number of enabled sub-DACs until all clock phases have been properly adjusted. However, in the last step, when all sub-DACs are enabled, instead of measuring the power of the unwanted spur, the calibration is performed by measuring the actual phase of the fundamental analog signal after it is downconverted using at least two different clock phases.

Figure 9A:
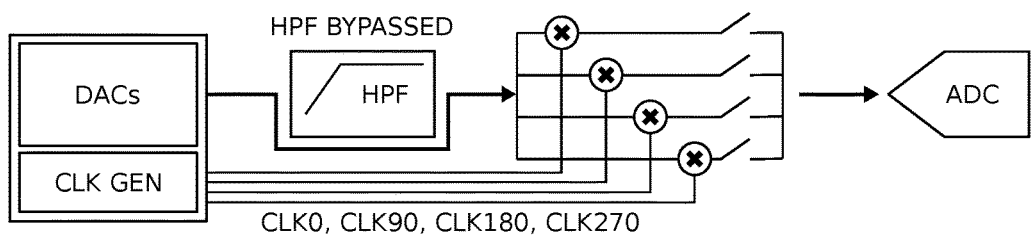
FIGS. 9A through 9C respectively represent a simplified schematic of the calibration system during Step E, the frequency spectrum prior to downconversion, and the frequency spectrum after downconversion in performance of the final step of phase calibration.
Figure 9B:
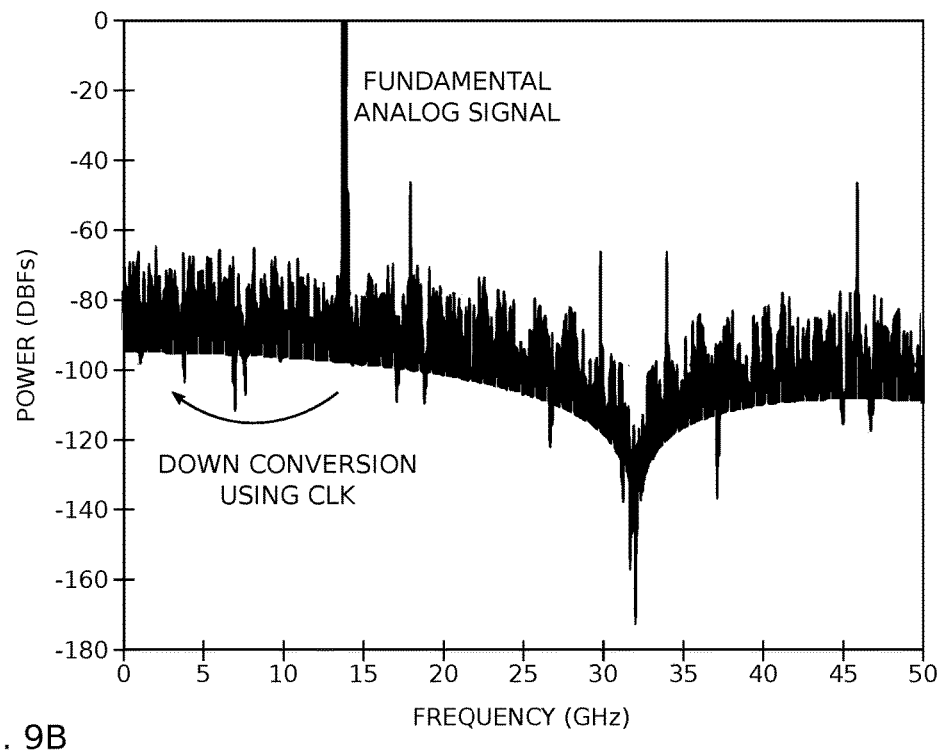
Figure 9C:
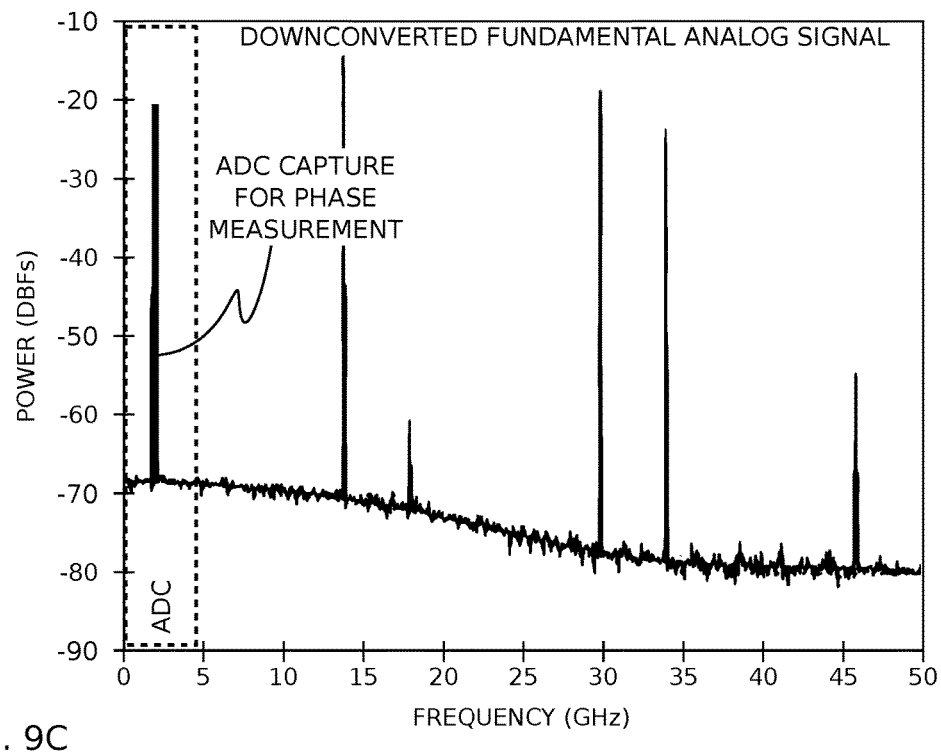

FIGS. 9A through 9C respectively represent a simplified schematic of the calibration system during Step E, the frequency spectrum prior to downconversion, and the frequency spectrum after downconversion in performance of the final step of phase calibration. For this measurement, the high-pass filter is disabled (bypassed), and the output frequency is increased, so that when it is downconverted, the downconverted fundamental analog signal occupies a frequency capable of conversion by the ADC. Since the clock signal's phase is embedded into the downconverted tone, the difference between the two measurements is equal to the phase difference between clock signals. As an example, if the fundamental output signal is downconverted with clock phases 0 and 90 degrees, the feedback loop delays one of the clock signals until a phase difference of 90 degrees between measurements is observed. However, any combination of clock phases can be used in the final step, including non-complementary clock phases.

Figure 10A:
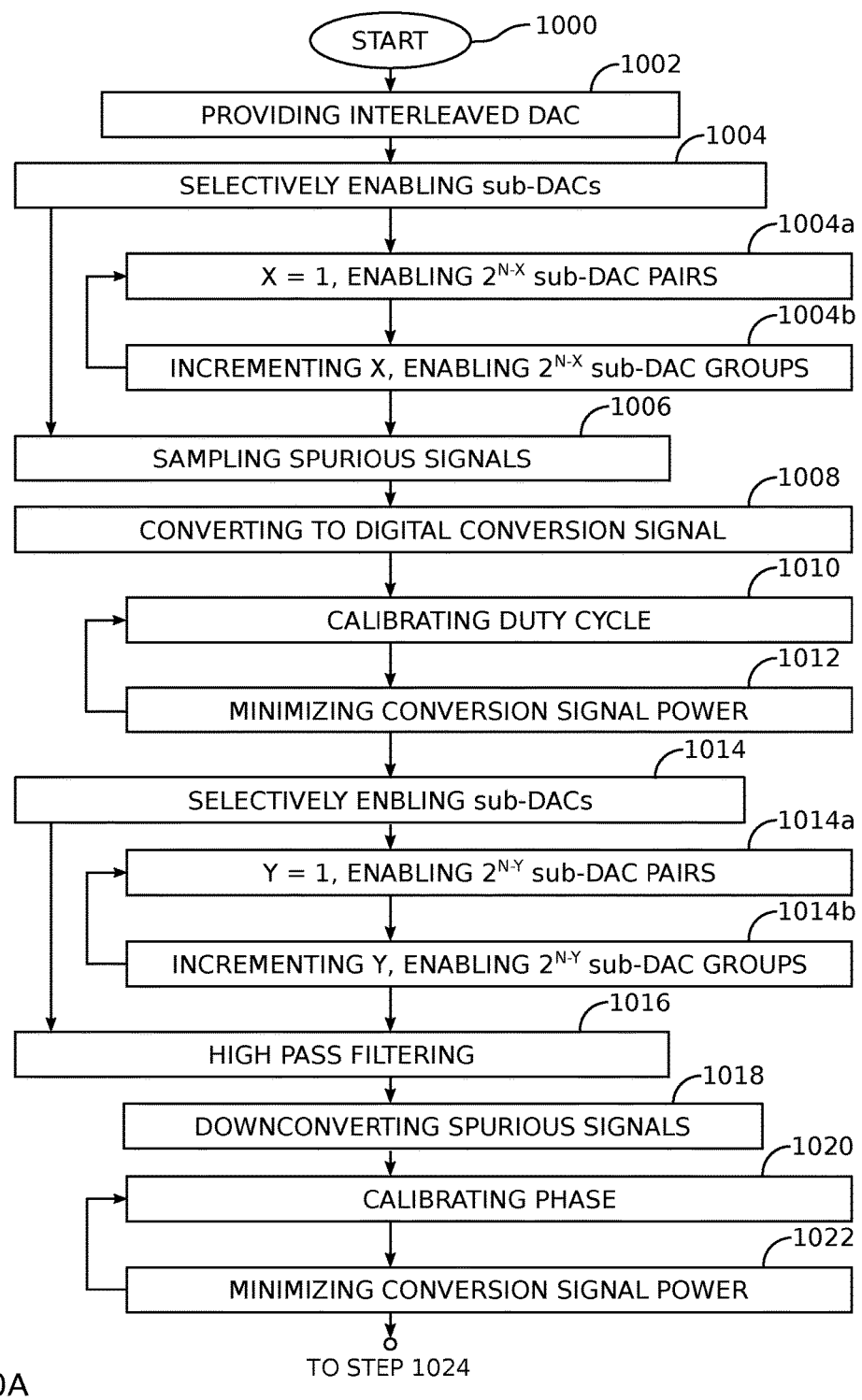
FIGS. 10A and 10B are a flowchart illustrating a method for calibrating an interleaved DAC.
Figure 10B:
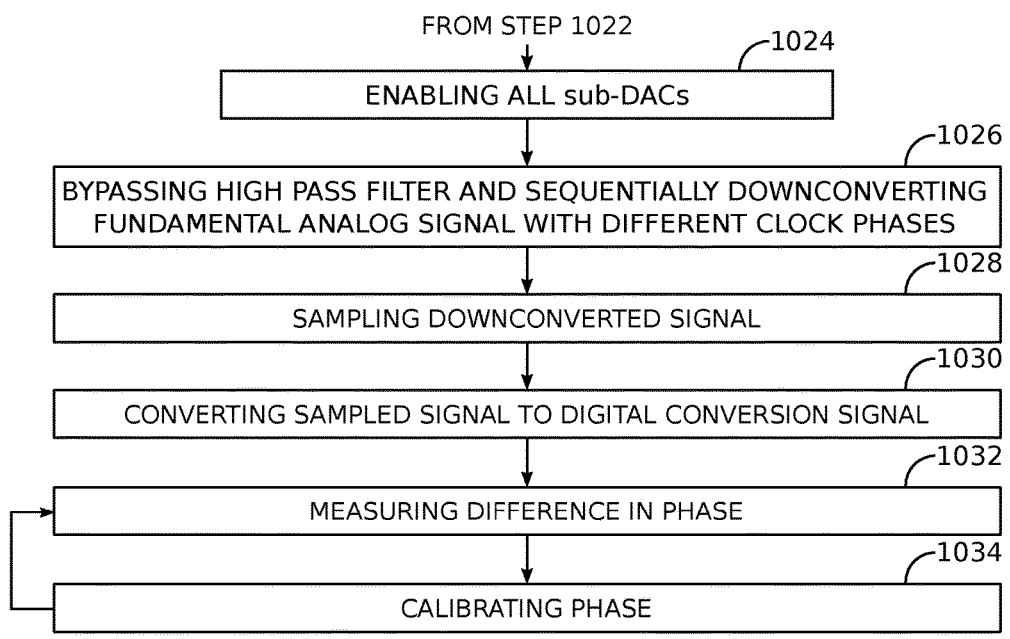

FIGS. 10A and 10B are a flowchart illustrating a method for calibrating an interleaved DAC. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method is in accordance with the figures presented above, and follows the numeric order of the depicted steps. The method starts at Step 1000.

Step 1002 provides an interleaved DAC comprising $2^N$ sub-DACs, where N is an integer greater than or equal to 1. Step 1004 selectively enables $2^M$ sub-DACs with unique phases of a first clock signal to supply a summed analog signal. The summed analog signal comprises a fundamental analog signal and spurious signals offset from a multiple a first clock signal frequency, where M is an integer less than or equal to N. Using a second clock signal having a frequency that is typically lower than the first clock signal frequency, Step 1006 samples the spurious signals. Step 1008 converts the sampled spurious signals to a digital conversion signal. Step 1010 calibrates the duty cycles between enabled sub-DACs, and in response to calibrating the duty cycles, Step 1012 minimizes the power of the conversion signal. Steps 1010 and 1012 are typically performed iteratively based upon a particular search algorithm.

In one aspect, selectively enabling the sub-DACs to supply a summed analog signal in Step 1004 includes supplying a fundamental analog signal higher in frequency than a Nyquist sampling limitation related to the second clock signal frequency, while sampling the spurious signals in Step 1006 includes sampling spurious signals having a frequency within the Nyquist sampling limitation related to the second clock frequency. The spurious signals supplied in Step 1004 are offset to a first clock signal frequency multiple equal to half the number of simultaneously enabled sub-DACs, with the offset being equal to the fundamental analog signal frequency.

More explicitly, selectively enabling the sub-DACs in Step 1004 includes substeps. Step 1004a (referred to as Step A above) sets X=1, and sequentially enables $2^{N-X}$ pairs of sub-DACs, with the sub-DACs in each pair using a unique set of first clock signal phases separated by $360/2^X$ degrees. When $2^{N-X}$ is greater than or equal to 1, Step 1004b (Step B) increments X by 1, increments the fundamental analog signal frequency, and sequentially enables $2^{N-X}$ groups of sub-DACs, with sub-DACs in each group using a unique set of first clock phases separated by $360/(2^X)$ degrees. The method repeats Step 1004b until $2^{N-X}$ is equal to 1.

Subsequent to calibrating the duty cycles in Step 1010, Step 1014 selectively enables sub-DACs to supply a summed analog signal comprising a fundamental analog signal within the Nyquist sampling limitation related to the second clock frequency and spurious signal offset from a multiple of the first clock signal frequency. Step 1016 high pass filters the fundamental analog signal, and Step 1018 downconverts the spurious signals, to a frequency within the Nyquist sampling limitation related to the second clock frequency, using the phases associated with the enabled sub-DACs. Step 1020 calibrates the differences in phase between enabled sub-DACs, and in response to calibrating the phases, Step 1022 minimizes the power of the conversion signals. Again, Steps 1020 and 1022 may be performed iteratively in response to a search algorithm.

More explicitly, selectively enabling the sub-DACs in Step 1014 includes sub-steps. Step 1014a (referred to as Step C above) sets Y=1, and sequentially enables $2^{N-Y}$ pairs of sub-DACs, with the sub-DACs in each pair using a unique set of first clock signal phases separated by $360/2^Y$ degrees. When $2^{N-Y}$ is greater than 1, Step 1014b (Step D) increments Y by 1, increments the fundamental analog signal frequency, and sequentially enables $2^{N-Y}$ groups of sub-DACs, with sub-DACs in each group using a unique set of first clock phases separated by $360/(2^Y)$ degrees.

Step 1014b repeats unless $2^{N-Y}$ is equal to 1, then Step 1024 (Step E) enables all $2^N$ sub-DACs to supply a fundamental analog signal higher in frequency than the Nyquist sampling limitation related to the second clock frequency. Step 1026 bypasses the high pass filtering, and sequentially downconverts the fundamental analog signal with at least a first phase and a second phase of the first clock signal. Step 1028 samples the downconverted fundamental analog signals. Step 1030 converts the sampled downconverted analog signals to digital conversion signals. Step 1032 measures the difference in phase between the conversion signals, and Step 1034 calibrates the difference in phase between conversion signals. Steps 1032 and 1034 may be iteratively performed in accordance with a search algorithm.

A system and method have been provided for calibrating an interleaved DAC. Examples of particular method steps and hardware implementations have been presented to illustrate the invention. However, the inventive concept is not limited to merely these examples. Other variations and embodiments of the invention will occur to those skilled in the art.

We claim:

1. A system for calibrating an interleaved digital-to-analog converter (DAC), the system comprising:
an interleaved DAC comprising $2^N$ selectively enabled sub-DACs, where N is an integer greater than or equal to 1, each sub-DAC having an input to accept a digital data signal, a clock input to accept a first clock signal at a first frequency with unique phase, and an output to supply an analog signal converted from the data signal;
a data generator having $2^N$ outputs to respectively supply $2^N$ data signals to the $2^N$ sub-DACs corresponding to a fundamental analog signal, and an input to accept signal generation commands;
a clock generator having an output to supply $2^N$ unique phases of the first clock signal;
a clock calibration module having an input to accept the $2^N$ phases of the first clock signal, an input to accept calibration signals, and $2^N$ outputs to selectively supply unique phases of the first clock signal to the enabled sub-DACs in response to the calibration signals;
a summing device having $2^N$ inputs to accept analog signals from enabled sub-DACs, and an output to supply a summed analog signal comprising the fundamental analog signal with spurious signals offset from a multiple of the first frequency of the first clock signal, where the spurious signals are responsive to duty cycle mismatch and first clock signal phases errors between enabled sub-DACs;
an analog-to-digital converter (ADC) having a signal input to accept the summed analog signal, a clock input to accept a second clock signal, and an output to supply a digital conversion signal converted from the summed analog signal; and,
a control module having an input to accept the conversion signal, an output to supply the signal generation commands, and an output to supply the calibration signals to the clock calibration module.

2. The system of claim 1 wherein the ADC accepts the first clock signal lower in frequency than the first clock signal first frequency.

3. The system of claim 2 wherein the ADC accepts spurious signals in an ADC input bandwidth related to the second clock signal frequency, in response to the fundamental analog signal having a frequency higher than the ADC input bandwidth.

4. The system of claim 3 wherein the control module comprises in Step A: sets X=1, sequentially compares $2^{N-X}$ pairs of sub-DACs, with the sub-DACs in each pair using a unique set of first clock signal phases separated by $360/2^X$ degrees, and calibrates duty cycles by minimizing a power of the spurious signals for each set;
when $2^{N-X}$ is greater than or equal to 1, the control module comprises in Step B increments X by 1, increments the fundamental analog signal frequency, and sequentially compares $2^{N-X}$ groups of sub-DACs, with sub-DACs in each group using a unique set of first clock phases separated by $360/(2^X)$ degrees, and calibrates duty cycles by minimizing the power of the spurious signals for each group; and,
wherein the control module repeats Step B until $2^{N-X}$ is equal to 1.

5. The system of claim 4 further comprising:
a high pass filter to attenuate signals in the ADC bandwidth, having a signal input to accept the summed analog signal from the summing device, and an output to supply a filtered analog signal;
a downconversion network having a signal input to accept the filtered analog signal, a phase port to accept $2^N$ phases of the first frequency from the clock calibration module, a control port to accept a phase selection signal from the control module, a signal output connected to the ADC input to supply a downconverted spurious signal in the ADC bandwidth responsive to the selected phases; and,
wherein control module, subsequent to calibrating the duty cycles, measures a power of the downconverted spurious conversion signals supplied by the ADC, and supplies calibration signals to the clock calibration module adjusting the difference between the first clock signal phases.

6. The system of claim 5 wherein the control module comprises in Step C sets Y=1, sequentially enables $2^{N-Y}$ pairs of sub-DACs, with the sub-DACs in each pair using a unique set of first clock signal phases separated by $360/2^Y$ degrees, uses the set of first clock signal phases to downconvert the spurious signals generated by the sub-DAC pair, and minimizes the power of the downconverted spurious signals by calibrating the phase difference between corresponding first clock signal phases supplied for each sub-DAC pair; and,
when $2^{N-Y}$ is greater than 1, the control module comprises in Step D increments Y by 1, increments the fundamental analog signal frequency, and sequentially enables $2^{N-Y}$ groups of sub-DACs, with sub-DACs in each group using a unique set of first clock phases separated by $360/(2^Y)$ degrees, uses the set of first clock signal phases to downconvert spurious signals generated by the group of sub-DACs, and minimizes the power of the downconverted spurious signals by calibrating the phase difference between corresponding first clock signal phases supplied for each sub-DAC group.

7. The system of claim 6 wherein the high pass filter is a selectively bypassable high pass filter having a control port to accept filter bypass control signals from the control module;
wherein the control module repeats Step D unless $2^{N-Y}$ is equal to 1, and then proceeds to Step E;
wherein the clock calibration module, in Step E, supplies $2^N$ phases of the first clock signal to the DAC in response to calibration signals from the control module, to enable all $2^N$ sub-DACs;
wherein the DAC supplies a fundamental analog signal higher in frequency than the ADC input bandwidth in response to the control module supplying signal generation commands to the data generator; and,
wherein the control module supplies filter bypass control signals for bypassing the high pass filter, supplies phase selection signals for sequentially downconverting the fundamental analog signal with at least a first phase and a second phase of the first clock signal, measures a difference in phase, and supplies calibration signals to the clock calibration module for calibrating the difference in phase between sequential conversion signals supplied by the ADC.

8. The system of claim 3 wherein the summing device supplies spurious signals offset from the multiple of the first frequency of the first clock signal, where the first frequency multiple is equal to half the number of simultaneously enabled sub-DACs.

9. The system of claim 5 wherein the downconversion network is selectively bypassable in response to downconversion bypass control signals from the control module.

10. The system of claim 1 wherein the summing device supplies a summed analog signal comprising spurious signals offset from a multiple of the first frequency by the fundamental analog signal frequency.

11. The system of claim 1 wherein the clock calibration module selectively supplies $2^M$ unique phases of the first clock signal to enabled sub-DACs in response to the calibration signals, where M is less than or equal to N.

12. A system for calibrating an interleaved digital-to-analog converter (DAC), the system comprising:
   an interleaved DAC comprising $2^N$ selectively enabled sub-DACs, where N is an integer greater than or equal to 1, each sub-DAC having an input to accept a digital data signal, a clock input to accept a first clock signal with unique phase, and an output to supply analog signals converted from the data signal;
   a data generator having $2^N$ outputs to respectively supply $2^N$ data signals to the $2^N$ sub-DACs corresponding to a fundamental analog signal, and an input to accept signal generation commands;
   a clock generator having an output to supply $2^N$ unique phases of the first clock signal;
   a clock calibration module having an input to accept the $2^N$ phases of the first clock signal, an input to accept calibration signals, and $2^N$ outputs to selectively supply unique phases of the first clock signal to the enabled sub-DACs in response to the calibration signals;
   a summing device having $2^N$ inputs to accept analog signals from enabled sub-DACs, and an output to supply a summed analog signal;
   an analog-to-digital converter (ADC) having a signal input to accept the analog signals, a clock input to accept a second clock signal, and an output to supply a digital conversion signal converted from the analog signals;
   a selectively bypassable signal conforming device interposed between the summing device output and the ADC signal input; and,
   a control module having an input to accept the conversion signal, an output to supply the signal generation commands, an output to supply signal conforming control signals, and an output to supply the calibration signals to the clock calibration module.

13. The system of claim 12 wherein the signal conforming device comprises:
   a selectively bypassable high pass filter having a signal input to accept the summed analog signal, an output to supply a selectively filtered analog signal, and a control port to accept a filter bypass control signal;
   a downconversion network, selectively bypassable in response to downconversion bypass control signals, having a signal input to accept the selectively filtered analog signal, a phase port to accept $2^N$ phases of the first clock signal from the clock calibration module, a control port to accept a phase selection signal, and a signal output to supply a selectively downconverted analog signals to the ADC responsive to the selected phases; and,
   wherein the control module supplies signal conforming control signals comprising the filter bypass control signals, phase selection signals, and downconversion bypass control signals.

14. The system of claim 13 wherein the ADC accepts a second clock signal lower in frequency than the first clock signal first frequency.

15. The system of claim 14 wherein the ADC accepts spurious signals in an ADC input bandwidth related to the second clock signal frequency, in response to the fundamental analog signal having a frequency higher than the ADC input bandwidth.

16. The system of claim 15 wherein the control module comprises in Step A: sets X=1, sequentially compares $2^{N-X}$ pairs of sub-DACs, with the sub-DACs in each pair using a unique set of first clock signal phases separated by $360/2^X$ degrees, and calibrates duty cycles by minimizing the power of the spurious signals for each set;
   when $2^{N-X}$ is greater than or equal to 1, the control module comprises in Step B increments X by 1, increments the fundamental analog signal frequency, and sequentially compares $2^{N-X}$ groups of sub-DACs, with sub-DACs in each group using a unique set of first clock phases separated by $360/(2^X)$ degrees, and calibrates duty cycles by minimizing a power of the spurious signals for each group; and,
   wherein the control module repeats Step B until $2^{N-X}$ is equal to 1.

17. The system of claim 16 wherein the control module, subsequent to calibrating the duty cycles, enables the high pass filter to attenuate signals in the ADC bandwidth, enables the downconversion network to supply a downconverted spurious signal in the ADC bandwidth responsive to the selected phases, measures the power of the downconverted spurious conversion signals supplied by the ADC, and supplies calibration signals to the clock calibration module adjusting the difference between the first clock signal phases.

18. The system of claim 17 wherein the control module comprises in step C sets Y=1, sequentially enables $2^{N-Y}$ pairs of sub-DACs, with the sub-DACs in each pair using a unique set of first clock signal phases separated by $360/2^Y$ degrees, uses the set of first clock signal phases to downconvert the spurious signals generated by the sub-DAC pair, and minimizes the power of the downconverted spurious signals by calibrating the phase difference between corresponding first clock signal phases supplied for each sub-DAC pair; and,
   when $2^{N-Y}$ is greater than 1, the control module comprises in step D increments Y by 1, increments the fundamental analog signal frequency, and sequentially enables $2^{N-Y}$ groups of sub-DACs, with sub-DACs in each group using a unique set of first clock phases separated by $360/(2^Y)$ degrees, uses the set of first clock signal phases to downconvert spurious signals generated by the group of sub-DACs, and minimizes the power of the downconverted spurious signals by calibrating the phase difference between corresponding first clock signal phases supplied for each sub-DAC group.

19. The system of claim 18 wherein the clock calibration module repeats Step D unless $2^{N-Y}$ is equal to 1, and then proceeds to Step E by supplying $2^N$ phases of the first clock signal to the DAC in response to calibration signals from the control module, to enable all $2^N$ sub-DACs;
   wherein the DAC supplies a fundamental analog signal higher in frequency than the ADC input bandwidth in response to the control module supplying signal generation commands to the data generator; and, wherein the control module supplies filter bypass control signals for bypassing the high pass filter, supplies phase selection signals for sequentially downconverting the fundamental analog signal with at least a first phase and a second phase of the first clock signal, measures a difference in phase, and supplies calibration signals to the clock calibration module for calibrating the difference in phase between sequential conversion signals supplied by the ADC.

20. The system of claim 15 wherein the summing device supplies spurious signals offset from a multiple of the first frequency of the first clock signal, where the first frequency multiple is equal to half the number of simultaneously enabled sub-DACs.

21. The system of claim 12 wherein the summing device supplies a summed analog signal comprising spurious signals offset from a multiple of the first frequency by the fundamental analog signal frequency.

22. A method for calibrating an interleaved digital-to-analog converter (DAC), the method comprising:

providing an interleaved DAC comprising $2^N$ sub-DACs, where N is an integer greater than or equal to 1;

selectively enabling $2^M$ sub-DACs with unique phases of a first clock signal to supply a summed analog signal comprising a fundamental analog signal and spurious signals offset from a multiple a first clock signal frequency, where M is an integer less than or equal to N;

using a second clock signal having a frequency lower than the first clock signal frequency, sampling the spurious signals;

converting the sampled spurious signals to a digital conversion signal;

calibrating duty cycles between enabled sub-DACs; and, in response to calibrating the duty cycles, minimizing a power of the conversion signal.

23. The method of claim 22 wherein selectively enabling the sub-DACs to supply the summed analog signal includes supplying a fundamental analog signal higher in frequency than a Nyquist sampling limitation related to the second clock signal frequency.

24. The method of claim 23 wherein sampling the spurious signals includes sampling spurious signals having a frequency within the Nyquist sampling limitation related to the second clock frequency.

25. The method of claim 24 wherein selectively enabling the sub-DACs comprises:

in Step A, setting X=1, and sequentially enabling $2^{N-X}$ pairs of sub-DACs, with the sub-DACs in each pair using a unique set of first clock signal phases separated by $360/2^X$ degrees;

when $2^{N-X}$ is greater than or equal to 1, in Step B, incrementing X by 1, incrementing the fundamental analog signal frequency, and sequentially enabling $2^{N-X}$ groups of sub-DACs, with sub-DACs in each group using a unique set of first clock phases separated by $360/(2^X)$ degrees; and, repeating Step B until $2^{N-X}$ is equal to 1.

26. The method of claim 22 wherein selectively enabling sub-DACs to supply spurious signals offset from a multiple the first clock signal frequency by the fundamental analog signal includes supplying spurious signals offset by a first clock signal frequency multiple equal to half the number of simultaneously enabled sub-DACs.

27. The method system of claim 22 wherein selectively enabling sub-DACS to supply the summed analog signal comprising the fundamental analog signal and spurious signals offset from a multiple of the first clock signal frequency includes supplying spurious signals offset from a multiple of the first frequency by the fundamental analog signal frequency.

28. The method of claim 22 further comprising:

subsequent to calibrating the duty cycles, selectively enabling sub-DACs to supply a summed analog signal comprising a fundamental analog signal within the Nyquist sampling limitation related to the second clock frequency and spurious signal offset from a multiple of the first clock signal frequency;

high pass filtering the fundamental analog signal;

downconverting the spurious signals, to a frequency within the Nyquist sampling limitation related to the second clock frequency, using the phases associated with the enabled sub-DACs;

calibrating the differences in phase between enabled sub-DACs; and, in response to calibrating the phases, minimizing the power of the conversion signals.

29. The method of claim 28 wherein selectively enabling the sub-DACs comprises:

in Step C, setting Y=1, and sequentially enabling $2^{N-Y}$ pairs of sub-DACs, with the sub-DACs in each pair using a unique set of first clock signal phases separated by $360/2^Y$ degrees; and, when $2^{N-Y}$ is greater than 1, in Step D, incrementing Y by 1, incrementing the fundamental analog signal frequency, and sequentially enabling $2^{N-Y}$ groups of sub-DACs, with sub-DACs in each group using a unique set of first clock phases separated by $360/(2^Y)$ degrees.

30. The method of claim 29 further comprising:

repeating Step D unless $2^{N-Y}$ is equal to 1, and then proceeding to Step E, by enabling all $2^N$ sub-DACs to supply a fundamental analog signal higher in frequency than the Nyquist sampling limitation related to the second clock frequency;

bypassing the high pass filtering, sequentially downconverting the fundamental analog signal with at least a first phase and a second phase of the first clock signal;

sampling the downconverted fundamental analog signals;

converting the sampled downconverted analog signals to digital conversion signals;

measuring the difference in phase between the conversion signals; and, calibrating the difference in phase between conversion signals.

* * * * *

UNITED STATES PATENT AND TRADEMARK OFFICE
CERTIFICATE OF CORRECTION

PATENT NO. : 10,461,764 B1
APPLICATION NO. : 16/430560
DATED : October 29, 2019
INVENTOR(S) : Pedro Emiliano Paro Filho and Costantino Pala It is certified that error appears in the above-identified patent and that said Letters Patent is hereby corrected as shown below:

In the Claims

In Claim 2, at Column 11, at Line 45, the phrase "first clock" (first occurrence) should be "second clock".

Signed and Sealed this
Fourteenth Day of April, 2020

Andrei Iancu
*Director of the United States Patent and Trademark Office*